United States Patent
Shia et al.

(10) Patent No.: US 9,207,258 B2
(45) Date of Patent: Dec. 8, 2015

(54) COMPOSITE WIRE PROBES FOR TESTING INTEGRATED CIRCUITS

(71) Applicants: David Shia, Portland, OR (US); Todd P. Albertson, Warren, OR (US); Kip P. Stevenson, Portland, OR (US)

(72) Inventors: David Shia, Portland, OR (US); Todd P. Albertson, Warren, OR (US); Kip P. Stevenson, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 280 days.

(21) Appl. No.: 13/631,599

(22) Filed: Sep. 28, 2012

(65) Prior Publication Data

US 2014/0091821 A1 Apr. 3, 2014

(51) Int. Cl.
| | |
|---|---|
| *G01R 1/067* | (2006.01) |
| *G01R 31/26* | (2014.01) |
| *G01R 3/00* | (2006.01) |
| *G01R 31/28* | (2006.01) |

(52) U.S. Cl.
CPC .............. *G01R 1/06761* (2013.01); *G01R 3/00* (2013.01); *G01R 31/2886* (2013.01)

(58) Field of Classification Search
CPC .. G01R 1/06761; G01R 3/00; G01R 31/2886; B21F 19/00; B23H 7/08; B32B 15/00; B32B 15/01; B32B 15/013; B32B 15/015; B32B 15/04; B32B 15/043; B32B 15/18
USPC ............ 324/754.03, 754.01, 755.01, 755.07, 324/762; 365/173, 139
See application file for complete search history.

(56) References Cited

U.S. PATENT DOCUMENTS

| | | | | |
|---|---|---|---|---|
| 2,904,717 | A | * | 9/1959 | Kerstetter ................ 313/355 |
| 2,918,722 | A | * | 12/1959 | Kenmore ................. 428/658 |
| 3,844,909 | A | * | 10/1974 | McCary et al. .......... 205/138 |
| 3,866,192 | A | * | 2/1975 | Ulmer et al. ............. 365/173 |
| 3,983,521 | A | * | 9/1976 | Furuto et al. ............ 335/216 |
| 4,935,594 | A | * | 6/1990 | Groos et al. .......... 219/69.12 |
| 5,476,209 | A | * | 12/1995 | Kojima et al. .......... 228/131 |
| 6,322,907 | B1 | * | 11/2001 | Hauser et al. ........... 428/683 |
| 6,806,433 | B2 | * | 10/2004 | Barthel et al. ........ 219/69.12 |
| 7,724,009 | B2 | * | 5/2010 | Ku et al. ............... 324/754.07 |
| 2008/0204062 | A1 | * | 8/2008 | Tran et al. ................ 324/762 |
| 2013/0056241 | A1 | * | 3/2013 | Gao et al. .............. 174/126.2 |

FOREIGN PATENT DOCUMENTS

WO WO 2005097387 A1 * 10/2005

* cited by examiner

*Primary Examiner* — Tung X Nguyen
*Assistant Examiner* — David Frederiksen
(74) *Attorney, Agent, or Firm* — Blakely, Sokoloff, Taylor & Zafman LLP

(57) ABSTRACT

An electrical probe of an aspect includes a high yield strength wire core. The high yield strength wire core includes predominantly one or more materials selected from tungsten, tungsten-copper alloy, tungsten-nickel alloy, beryllium-copper alloy, molybdenum, stainless steel, and combinations thereof. The high mechanical strength wire core has a yield strength of at least 1 gigapascal (GPa) at temperature of 250° C. The electrical probe also includes a low electrical resistivity layer concentrically around the high yield strength wire core. The concentric layer includes predominantly one or more materials selected from silver, gold, copper, and combinations thereof. The low electrical resistivity layer has an electrical resistivity of no more than $2\times10^{-8}$ Ohm-meters. The electrical probe has an outer cross-sectional dimension of the electrical probe that is no more than 50 micrometers. Between 60 to 85% of the outer cross-sectional dimension is provided by the high mechanical strength wire core. Between 10 to 30% of the outer cross-sectional dimension is provided by the low electrical resistivity layer.

20 Claims, 9 Drawing Sheets

COMPOSITE WIRE PROBES FOR TESTING INTEGRATED CIRCUITS

BACKGROUND

1. Field

Embodiments relate to the field of integrated circuit manufacturing. In particular, embodiments relate to the field of probes to electrically test integrated circuits.

2. Background Information

Integrated circuits are commonly electrically tested during integrated circuit manufacturing. During the electrical testing, electrical probes may be used to establish electrical contact between exposed or external electrical contacts of the integrated circuit under test and manufacturing test equipment. Terminal ends of the electrical probes may be contacted with the exposed electrical contacts, and then electrical signals may be exchanged between the manufacturing test equipment and the integrated circuit under test according to a test protocol.

In order to provide good contact, the size of the probes generally depends upon the size and/or the spacing (e.g., the pitch) of the exposed electrical contacts of the integrated circuits. In addition, there is a trend toward ever smaller electrical contacts and ever smaller spacing between the electrical contacts. One challenge is that, as the cross sectional area of the electrical probes decrease, the current carrying capacity of the electrical probes also generally decreases. The current carrying capacity generally represents the amount of current the electrical probes can carry without physical damage. When the cross sections of the electrical probes are too small for the current they are expected to carry, the amount of heat generated by resistance may cause the temperature of the electrical probes to increase to a point that damage occurs (e.g., melting, oxidation or other damaging reaction, etc.).

One approach to attempt to address this problem is to use tungsten, tungsten alloy, or other refractory metal or refractory metal alloy as the material of the electrical probes. These materials generally tend to have relatively high mechanical strength at high temperatures. However, these materials also generally tend to have relatively low electrical and thermal conductivities, which tend to counteract the benefit of the relatively high mechanical strength.

Another approach to attempt to address this problem is to form electrical probes as a micro-electro-mechanical system (MEMS) by a lithographic process involving lithographic patterning of a photoresist and development together with chemical and/or physical deposition processes. Stacks of two different materials may be formed alternately one layer over the other in a sandwich-like structure. One of the two materials may have a relatively high mechanical strength and another of the two materials may have relatively high electrical and thermal conductivities. However, drawbacks to this approach include relatively high manufacturing costs and relatively long assembly lead times, especially for relatively small cross sections.

BRIEF DESCRIPTION OF THE SEVERAL VIEWS OF THE DRAWINGS

The invention may best be understood by referring to the following description and accompanying drawings that are used to illustrate embodiments of the invention. In the drawings.

DETAILED DESCRIPTION

In the following description, numerous specific details, such as, for example, particular materials, layer thicknesses, combinations of layers, probe card designs, and the like, are set forth. However, it is understood that embodiments of the invention may be practiced without these specific details. In other instances, well-known circuits, structures and techniques have not been shown in detail in order not to obscure the understanding of this description.

Figure 1:
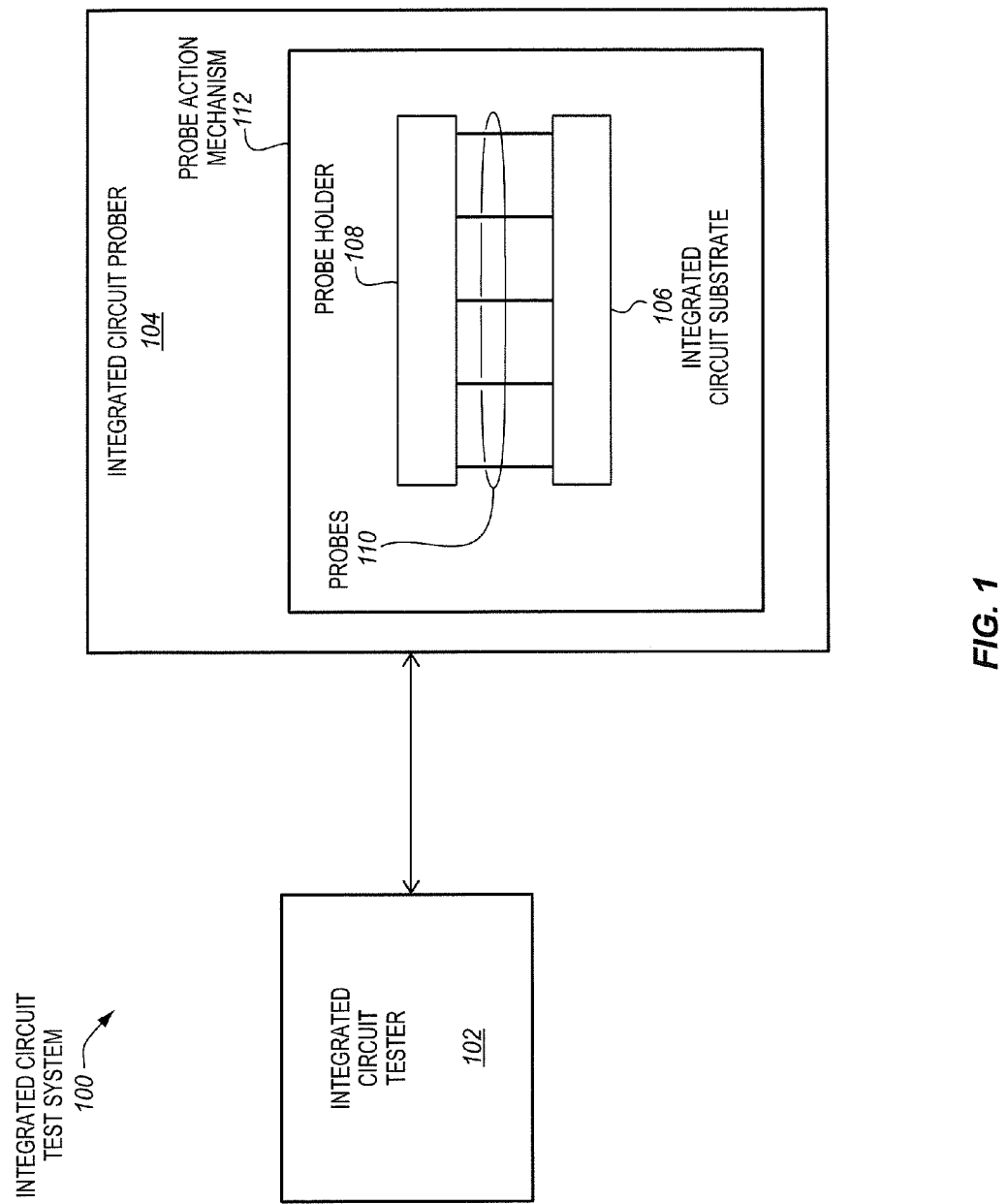
FIG. 1 is a block diagram of an embodiment of an integrated circuit test system.

FIG. 1 is a block diagram of an embodiment of an integrated circuit test system 100. The integrated circuit test system includes an integrated circuit tester 102 and an integrated circuit prober 104. The integrated circuit tester and the integrated circuit prober are coupled, or otherwise in communication with, one another. The integrated circuit tester and the integrated circuit prober may each represent substantially conventional integrated circuit manufacturing machines or equipment and/or integrated circuit testing machines or equipment. The integrated circuit tester and prober may be implemented in hardware together with software, firmware, or a combination of software and firmware.

Deployed in the integrated circuit prober is an integrated circuit substrate 106. By way of example, the integrated circuit substrate may represent a wafer having a plurality of dice or a singulated individual die. The integrated circuit substrate includes exposed or external electrical contacts (e.g., pads, bumps, solder, other exposed conductive structures electrically coupled with interconnects and/or circuitry of the substrate, etc.).

Also deployed in the integrated circuit prober is an embodiment of a probe holder 108 having an embodiment of a plurality of electrical probes 110. The probe holder may be mechanically and electrically docked or otherwise mechanically and electrically coupled with the prober. The probe holder is electrically coupled with the tester. The probe holder generally represents a device to provide a sufficiently sturdy mechanical support structure for the probes that helps to protect the probes and allow the probes to be handled together. Additionally, the probe holder generally represents a device to transform the layout of the electrical contacts into the layout of proper electrical connectors appropriate for the proper. The probe holder may represent a probe card, probe head, probe carrier, or other device to carry, hold, or otherwise provide the plurality of probes. The probe holder is not limited to any known type of design, but rather may have any of various different types of designs known in the arts for probe cards, probe holders, probe heads, other devices to provide probes, etc. The probes may represent any of the various different embodiments of probes described elsewhere herein.

The integrated circuit prober may include a probe action mechanism 112 that is operable to manipulate or move the probe holder and/or the integrated circuit substrate relative to one another so that terminal ends of embodiments of probes contact the exposed electrical contacts of the integrated circuit substrate. Either the probe holder may be moved, or the integrated circuit substrate may be moved, or both the probe holder and the integrated circuit substrate may be moved. By way of example, the mechanism may include a robotic arm to move the probe holder and a vacuum mount chuck to hold and potentially move the integrated circuit substrate. In some cases, the probe action mechanism may include a machine vision system, such as one or more cameras and machine vision software, to align the probes relative to the exposed electrical contacts.

The integrated circuit tester is electrically coupled with the probes and may be operable to test the integrated circuit substrate according to a test protocol. The integrated circuit tester may cause electrical signals to be exchanged with the integrated circuit substrate through the probes. For example, the integrated circuit test system may provide power to the integrated circuit substrate through some of the probes, and exchange electrical signals with the integrated circuit substrate through other of the probes. The electrical signals may be exchanged according to a test protocol or particular test patterns (e.g., in an effort to test for functional defects). Electrical signals received from the integrated circuit substrate may be analyzed as part of the testing. In some embodiments, results of the testing may be stored (e.g., for future use in processing the integrated circuit substrate). Either the whole integrated circuit substrate may be tested at once (e.g., all of the dice) or different portions thereof (e.g., different die thereof) may be tested individually/sequentially.

In some embodiments, testing may be performed during wafer test and sort. During wafer test and sort, a wafer is tested before its dice are separated from one another. The testing of the wafer helps to identify which of the dice are "good" (e.g., sufficiently pass the test) versus which are "bad" (e.g., fail the test). The outcome of the testing may be stored and used for subsequent processing (e.g., to identify the good die to package versus the bad die to discard or re-work. Identifying the bad dice may help to avoid time and costs associated with processing and packaging bad dice. In some cases, wafer test and sort may also be used to categorize the good device based on various levels of speed or performance. In other embodiments, individual separated die may be electrically tested after a wafer has been diced. Electrical testing may also be performed at other points in a manufacturing process and/or for other purposes without limitation on the scope of the invention.

Figure 2:
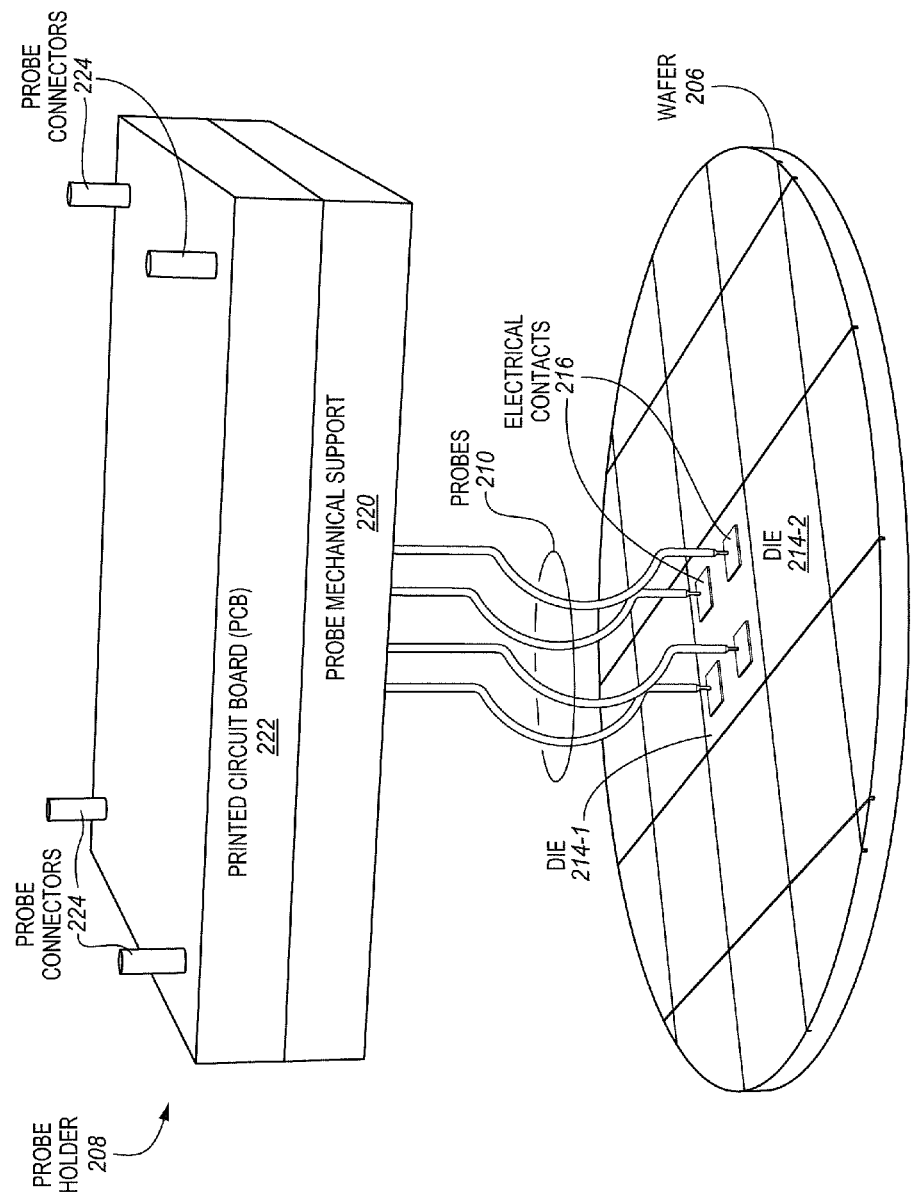
FIG. 2 is a perspective view of an embodiment of a probe holder having an embodiment of a plurality of probes coupled with exposed electrical contacts of a die of a wafer also having another die.

FIG. 2 is a perspective view of an embodiment of a probe holder 208 having an embodiment of a plurality of probes 210 coupled with exposed electrical contacts 216 of a die 214-1 of a wafer 206 also having another die 21-2. The probe holder may represent any of various different types of probe cards or like devices known in the arts. Examples of suitable types of probe holders, but are not limited to, high-density vertical probe cards, epoxy-based probe cards (e.g., epoxy ring probe cards), blade-based probe cards, membrane probe cards, micro-spring probe cards, vertical probe cards, and other probe cards known in the arts.

The wafer generally has the shape of a round thin disc. By way of example, the wafer may range from around two to around twelve inches in diameter, and may have a thickness of around an eighth of an inch or less, although this is not required. The wafer may include semiconductor (e.g., silicon), conductor (e.g., metal), insulating (e.g., dielectric), and various other types of materials conventionally used for wafers. The wafer includes a number of die 214-1, 214-2. For simplicity, in the illustration, the wafer includes only a few dice, although often a wafer may include anywhere from tens to hundreds of dice. Each die may include integrated circuitry (e.g., transistors, resistors, capacitors, interconnect, etc.) that is embedded or formed within the materials of the wafer.

The outside surface of the wafer and/or each die may include a number of exposed or external electrical contacts 216. For simplicity, in the illustration only four are shown, although anywhere from tens to many hundreds may be included for a probe holder. The electrical contacts broadly represent conductive structures that are accessible from the outside of the wafer and that are electrically coupled with interconnects of the wafer. Examples of suitable types of electrical contacts include, but are not limited to, pads (e.g., bond pads), bumps, solder, or other conductive structures or materials electrically coupled with interconnects of the wafer. Different configurations of the electrical contacts are suitable for the probe holder. The scope of the invention is not limited to any particular configuration. To further illustrate certain concepts, two common configurations will be briefly described, although the scope of the invention is not limited to any particular configuration.

Figure 3:
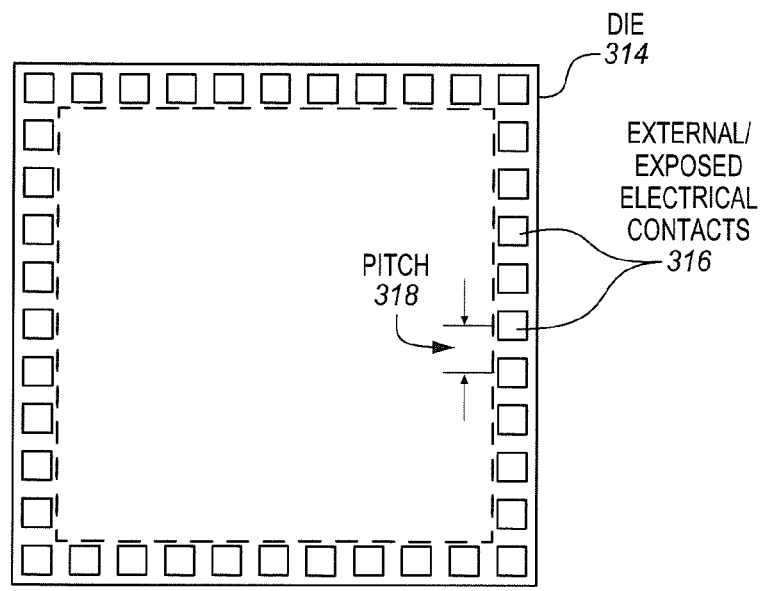
FIG. 3 is a top planar view of a first suitable configuration of electrical contacts for a die.

FIG. 3 is a top planar view of a first suitable configuration of electrical contacts 316 for a die 314. In this configuration, the electrical contacts (e.g., bond pads) are located along a periphery or perimeter of the die. The electrical contacts have spacing or pitch 318. An active region of the die is included generally within this periphery. Moreover, in this configuration, the electrical contacts are disposed on the top side of the die, which is the same side of the die where the integrated circuitry of the active region is formed. To package the die, individual bond wires may be used to electrically couple the electrical contacts to corresponding electrical contacts of a package substrate.

Figure 4:
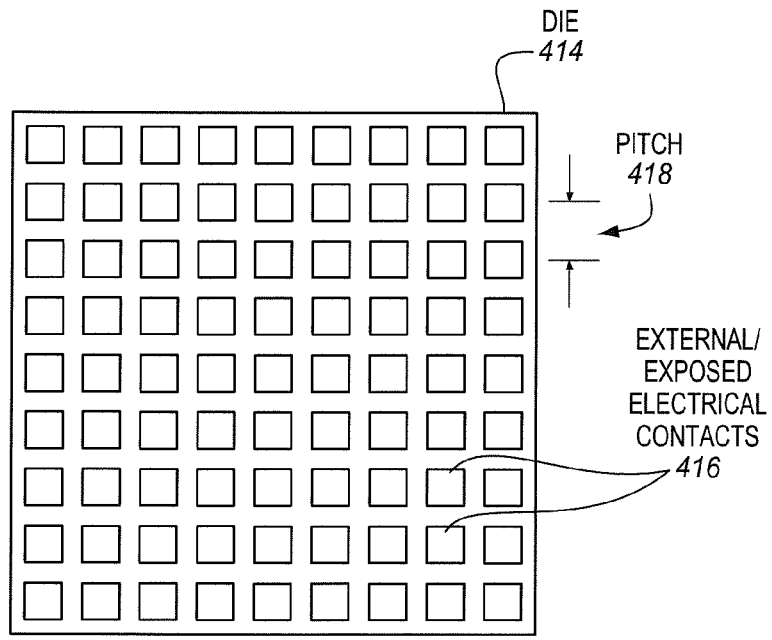
FIG. 4 is a top planar view of a second suitable configuration of electrical contacts for a die.

FIG. 4 is a top planar view of a second suitable configuration of electrical contacts 416 for a die 414. In this configuration, the electrical contacts (e.g., bond pads) are disposed across the entire surface of the die instead of only along the periphery, which allows more electrical contacts to be placed across the surface of the die. The electrical contacts have spacing or pitch 418. In this configuration, the electrical contacts are disposed on the bottom side of the die and active integrated circuitry is formed in an active region of the top side of the die. The electrical contacts are directly over the integrated circuitry in the active region. To package the die, solder balls may be included on each of the electrical contacts to electrically couple them to corresponding electrical contacts on a package substrate. The die may be mounted on the package substrate in a "flipped" orientation using flip-chip or Controlled Collapse Chip Connection (C4) technology.

Referring again to FIG. 2, the probe holder includes the plurality of probes 210. For simplicity, in the illustration only four probes are shown, although there may be anywhere from tens to thousands of probes. Any of the various embodiments of probes disclosed elsewhere herein are suitable. Each of the probes is fixedly physically and electrically coupled with the probe holder, and removably physically and electrically coupled with a different one of the electrical contacts. Each of the probes has a first terminal end (closest to the probe holder) that is fixedly adhered or otherwise fixedly coupled with a probe mechanical support 220 of the probe holder. Each of the probes also has a second free terminal end (closest to the wafer) that during use is in removable physical and electrical contact or coupling with a corresponding electrical contact.

The probe mechanical support generally represents a sufficiently mechanically sturdy structure or material to mechanically group and protect the probes. Examples of suitable types of probe mechanical supports include, but are not limited to, rings, blades, and other types of supports known in the arts. The probe mechanical support is also commonly formed of an electrically insulating material (e.g., ceramic, fiberglass, plastic, etc.), although other materials such as metals may optionally be used. The probe mechanical support may have square, rectangular, circular, ring, irregular, or other shapes. The probes may be adhered to the probe mechanical support with an epoxy, adhesive, or may be otherwise physically coupled with the mechanical support.

The probe mechanical support is physically coupled with a printed circuit board (PCB) 222. The first terminal ends of the probes (closest to the probe holder) are soldered or otherwise electrically coupled with metal traces or other circuitry of the PCB. The PCB represents the electrical interface between the probes and the prober. The circuitry of the PCB routes electrical signals from the probes to prober electrical connectors 224 arranged in a way appropriate for the proper. Examples of suitable types of proper electrical connectors include, but are not limited to, terminal pins (T-pins), pogo pads, edge connectors, and the like, and combinations thereof. The probes may be arranged in a way specific to, or at least based on, the layout of the electrical contacts on the integrated circuit. However, the prober may have a different layout and the probe holder may transform or route (e.g., through the circuitry of the PCB) the layout appropriate for the integrated circuit to the layout appropriate for the prober. The printed circuit board may also include circuit elements such as resistors, capacitors, inductors, or the like, to manipulate or control the electrical signals in various ways.

In some embodiments, each of the probes may be shaped to provide a flexing or springing action. As used herein, a shaped probe is broadly interpreted as not merely a straight probe, but rather one that includes one or more of a curve, a bend, a twist, a coil, or a combination thereof. The shaped probes may be used to provide a spring-like or flexing action when contacting the electrical contacts. When a terminal end of a probe contacts an electrical contact, the probe may begin to flex or spring-engage, which may help to reduce the amount of puncturing or damage to the electrical contacts and/or damage to the probes. Such a spring-like or flexing action may also help accommodate for differences in length of the probe wires and/or the heights of the electrical contacts (e.g., certain probes may contact their corresponding electrical contacts before other probes contact their corresponding electrical contacts). Also, during the contact in some cases a so-called scrubbing action and/or a certain amount of spring-like force may potentially be provided to scrub or break through a surface layer (e.g., a surface oxide) of the electrical contacts in order to improve electrical contact. Some shaped probes may provide for overtravel or lateral movement of the probe along the electrical contact after initial touchdown of the probe on the electrical contact. Such overtravel helps to provide the aforementioned scrubbing action.

In the particular illustrated embodiment, each of the shaped probes has a first straight segment coupled with the probe holder, a second straight segment coupled with an electrical contact, and a curved or arched central segment between the straight segments. The curved or arched central segment provides the spring-like or flexing action. This particular shape is not required. Other suitable embodiments of shaped probes will be discussed further below. Moreover, still other embodiments pertain to straight probes.

As previously discussed in the background section, the size of an electrical probe generally depends upon the size and/or the spacing (e.g., the pitch) of the exposed electrical contacts of the integrated circuits to be tested. In addition, there is a trend toward ever smaller electrical contacts and ever smaller spacing between the electrical contacts. One challenge is that, as the cross sectional area of the electrical probes decrease, the current carrying capacity of the electrical probes also generally decreases. The current carrying capacity generally represents the amount of current the electrical probes can carry without physical damage. When the cross sections of the electrical probes are too small for the current they are expected to carry, the amount of heat generated by resistance may cause the temperature of the electrical probes to increase to a point that damage occurs (e.g., melting, oxidation or other damaging reaction, etc.).

Figure 5:
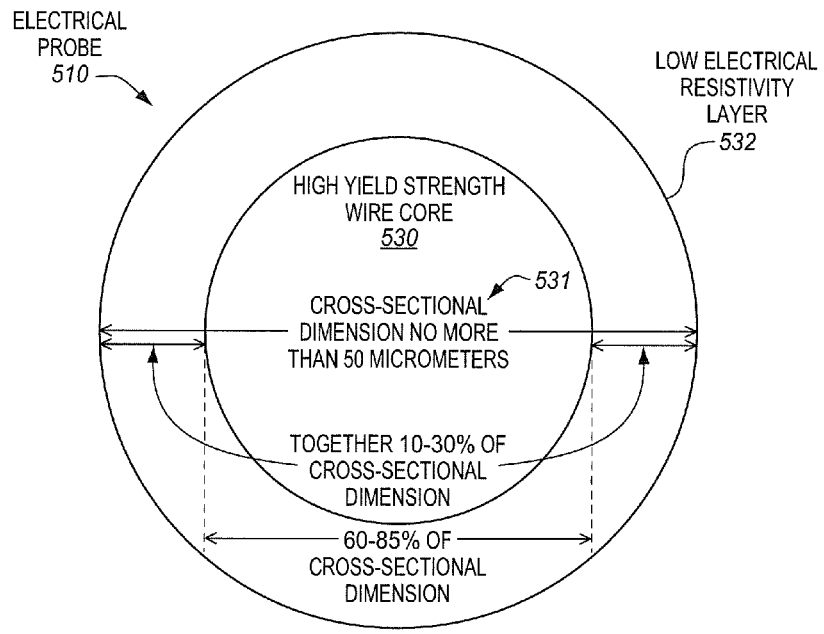
FIG. 5 is a cross-sectional view of an embodiment of an electrical probe.

FIG. 5 is a cross-sectional view of an embodiment of an electrical probe 510. As shown, in some embodiments, the electrical probe may have an outer diameter or other cross-sectional dimension 531 that is no more than about 50 μm. In some embodiments, the cross-sectional dimension may be no more than about 25 μm. As shown, in some embodiments, the electrical probe may have a substantially round cross section. For example, the substantially round cross section may be circular or elliptical. Alternatively, the round cross section may be approximated by a pentagonal, hexagonal, octagonal, or other polygonal cross section. It is to be appreciated that when manufacturing probes of such sizes that perfect circularity is difficult to achieve and that these terms are intended to encompass such imperfect circularities. The electrical probe generally will have an elongated wire-like structure often having a length (into the page in the illustration) that ranges from about 500 μm to many thousands of micrometers, or even longer.

The electrical probe includes a high yield strength wire core 530. The yield strength of a material may represent the stress at which the material begins to deform plastically. Prior to the yield strength the material may deform elastically and may return to substantially its original shape when the applied stress is removed. After then yield strength has been passed some of the deformation may remain after the stress is removed and be non-reversible. In some embodiments, the high yield strength wire core may have a high yield strength that is at least 1 gigapascal (GPa) at a temperature of 250° C. In large scale manufacturing, integrated circuit test probes are often expected to be capable of engaging and un-engaging (e.g., flexing and un-flexing) numerous times (e.g., potentially thousands to millions) without becoming significantly permanently deformed to be no longer practically useful. In some embodiments, the high yield strength wire core provides between about 60% to about 85%, or in some cases between about 65% to about 80%, of the outer cross-sectional dimension. In some embodiments, the high yield strength wire core includes predominantly one or more of the metals or materials tungsten, a tungsten-copper alloy, a tungsten-nickel alloy, a beryllium-copper alloy, molybdenum, stainless steel, and combinations thereof. In this description, the term metal may be used to refer to either a substantially pure single metallic element or an alloy, mixture, or other combination of two or more different elements in which at least one is a metallic element. In this description, the term alloy may include metal elements as well as non-metal elements. In this description, stainless steel refers to an iron alloy including between about 8 wt % to about 35 wt % chromium. In some aspects, the high yield strength wire core may include a homogeneous core including a single one of these materials. For example, in one particular embodiment, the homogeneous core may comprise predominantly or in some cases consist essentially of one of tungsten, a tungsten-copper alloy, or a tungsten-nickel alloy. Alternatively, in other aspects, the high yield strength wire core may be a composite core including an inner core having one of these materials and at least one concentric core layer having a different one of these materials. In some embodiments, the high yield strength wire core or the inner core thereof may be formed by drawing the aforementioned material through a die. The fact that the wire core was drawn through a die may be indicated by die marks or die lines caused by imperfections in the die being present on the wire core.

The electrical probe also includes a low electrical resistivity layer 532. The low electrical resistivity layer is concentrically disposed around the high yield strength wire core. The low electrical resistivity layer has an electrical resistivity of no more than $2\times10^{-8}$ Ohm-meters ($\Omega$-m) at room temperature which is approximately the electrical resistivity of copper. In some embodiments, the low electrical resistivity layer may provide between about 10% to about 30%, or in some cases between about 15% to about 25%, of the outer cross-sectional dimension. If desired, in other embodiments, the amount of the low electrical resistivity layer may be even less, for example between about 5% to about 15%, with the amount being made up of other materials (e.g., those of the high yield strength wire core), although this may tend to reduce the electrical conductivity of the electrical probe. In some embodiments, the low electrical resistivity layer includes predominantly one or more of silver, gold, copper, and combinations thereof. In some aspects, the low electrical resistivity layer may include a homogeneous layer including a single one of these materials. For example, in one particular embodiment, the homogeneous layer may consist essentially of silver. Alternatively, in other aspects, the low electrical resistivity layer may be a composite or laminate including two or more concentric layers each including a different one of these materials. In some embodiments, the low electrical resistivity layer(s) may be formed by plating (e.g., electroplating) a metal on the high yield strength wire core.

In some embodiments, the electrical probe may have an electrical resistivity of no more than $3\times10^{-8}$ $\Omega$-m at room temperature. In some embodiments, the electrical probe may have a yield strength of at least 500 megapascal (MPa).

Advantageously, the electrical probe includes a mechanical core operable to provide good high temperature mechanical properties together with a concentric layer around the mechanical core to provide low electrical and thermal resistivity properties. Different materials may be used for the core and the concentric layer rather than attempting to find one alloy that meets both of these goals. Desired current carrying capacities as well as desired mechanical properties may be achieved even when the diameters or cross-sectional dimensions of the electrical probes are no more than about 50 micrometers ($\mu$m), or in some cases no more than about 25 $\mu$m. Moreover, the electrical probes may be manufactured by drawing the core through a die and plating one or more layers on the core, without needing to rely on a lithographic-based process, which tends to be costly.

Figure 6:
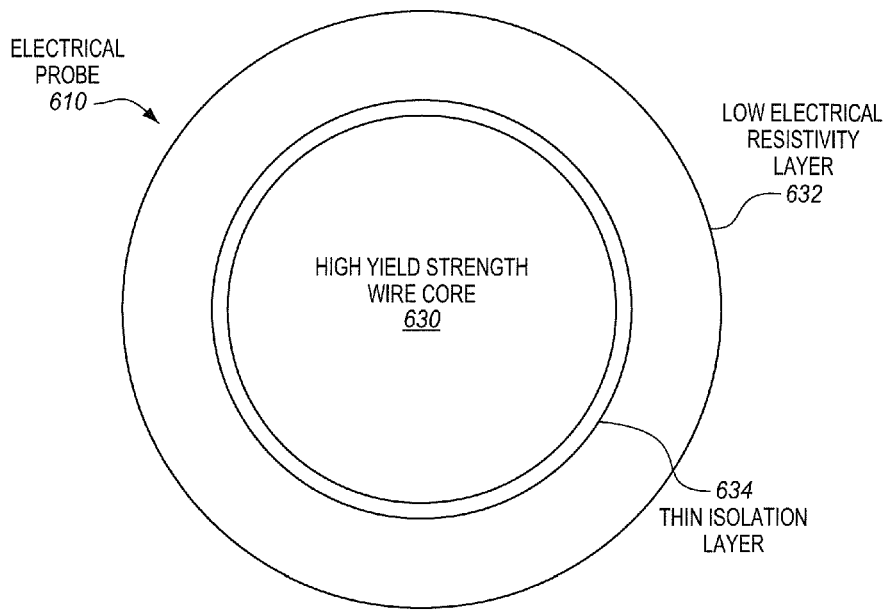
FIG. 6 is a cross-sectional view of an embodiment of an electrical probe including an optional thin isolation layer concentrically disposed between a high yield strength wire core and a low electrical resistivity layer.

FIG. 6 is a cross-sectional view of an embodiment of an electrical probe 610 including an optional thin isolation layer 634 concentrically disposed between a high yield strength wire core 630 and a low electrical resistivity layer 632. In some embodiments, the thin isolation layer may have a thickness ranging between about 0.1 to about 0.6 $\mu$m, or in some cases between about 0.3 to about 0.6 $\mu$m. Thicknesses greater than 0.6 $\mu$m may also optionally be used but tend to begin to more significantly affect the mechanical properties of the electrical probe (e.g., how it flexes). In some embodiments, the thin isolation layer may include predominantly one or more of nickel, cobalt, and a combination thereof. In one particular embodiment, the thin isolation layer may include a 0.3 to 0.6 $\mu$m layer of nickel, although this is not required. The thin isolation layer may be operable to prevent, or at least reduce, contact between the materials of the high yield strength wire core and the low electrical resistivity layer. Without the thin isolation layer, the materials of the high yield strength wire core and the low electrical resistivity layer at the interface may tend to inter-diffuse or inter-mix and may potentially react to form intermetallic compounds. Such intermetallic compounds often tend to have undesirable properties (e.g., be brittle). The inclusion of the thin isolation layer may help to reduce the inter-mixing of these materials and/or the formation of intermetallic compounds. In some embodiments, the thin isolation layer may be formed by plating (e.g., electroplating) a metal on the high yield strength wire core, and then the low electrical resistivity layer may be formed by plating (e.g., electroplating) the low electrical resistivity layer on the thin isolation layer. The high yield strength wire core and the low electrical resistivity layer may be described in conjunction with FIG. 5.

Figure 7:
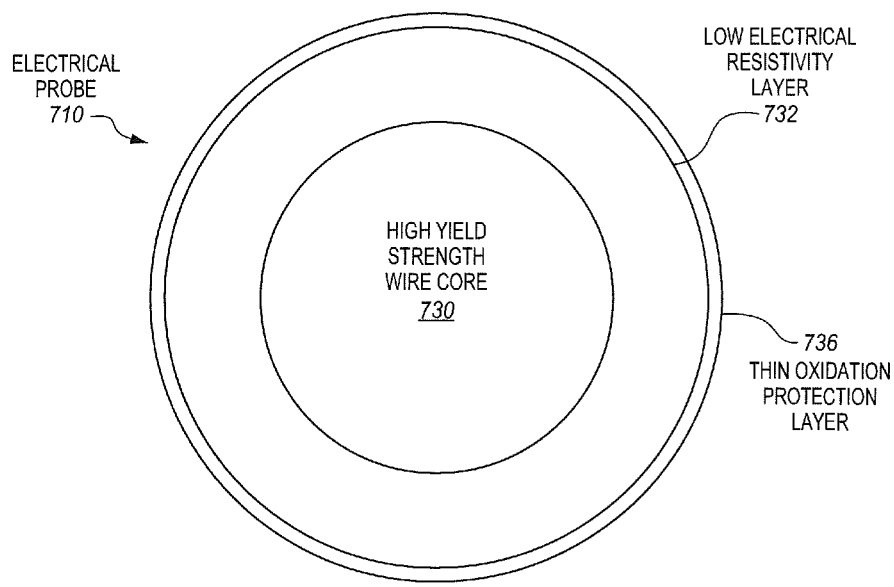
FIG. 7 is a cross-sectional view of an embodiment of an electrical probe including a high yield strength wire core, a low electrical resistivity layer, and an optional thin oxidation protection layer concentrically disposed around the low electrical resistivity layer.

FIG. 7 is a cross-sectional view of an embodiment of an electrical probe 710 including a high yield strength wire core 730, a low electrical resistivity layer 732, and an optional thin oxidation protection layer 736 concentrically disposed around the low electrical resistivity layer. The thin oxidation protection layer provides an outside surface of the electrical probe. In some embodiments, the thin oxidation protection layer may have a thickness ranging between about 0.1 to about 0.6 $\mu$m, or in some cases between about 0.3 to about 0.6 $\mu$m. In some embodiments, the thin oxidation protection layer may include predominantly one or more of gold, platinum, ruthenium, rhodium, palladium, osmium, iridium, chromium, and combinations thereof. Gold, platinum, ruthenium, rhodium, palladium, osmium, and iridium represent noble metals. In one particular embodiment, the thin oxidation protection layer may include a 0.3 to 0.6 $\mu$m layer of gold, although this is not required. The thin oxidation protection layer may be operable to prevent, or at least reduce, oxidation of the underlying low electrical resistivity layer. Without the thin oxidation protection layer, the material of the low electrical resistivity layer may potentially oxidize or react with the environment. In some embodiments, the thin oxidation protection layer may be formed by plating (e.g., electroplating) a metal on the low electrical resistivity layer. The high yield strength wire core and the low electrical resistivity layer may be described in conjunction with FIG. 5.

Figure 8:
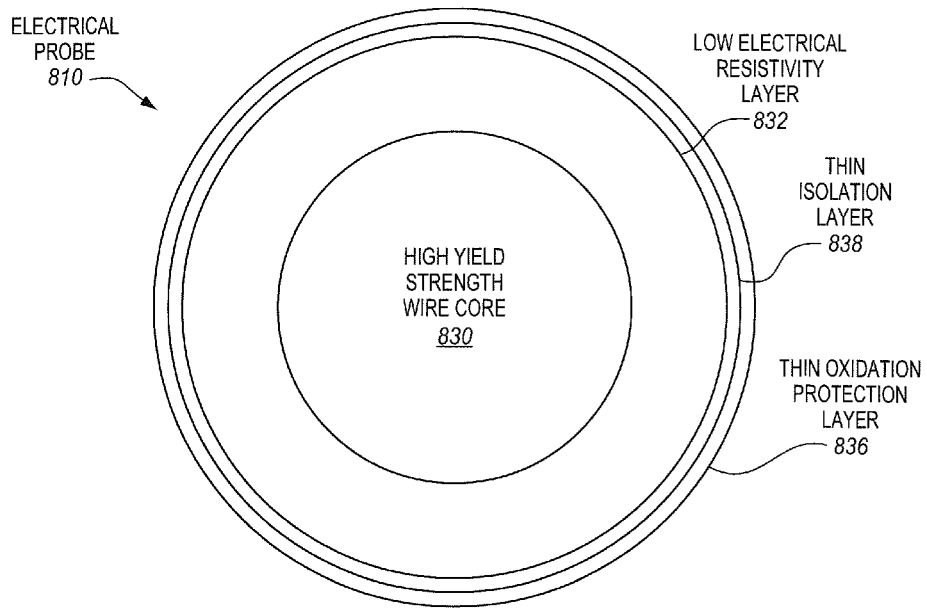
FIG. 8 is a cross-sectional view of an embodiment of an electrical probe including a high yield strength wire core, a low electrical resistivity layer, an optional thin oxidation protection layer concentrically disposed over the low electrical resistivity layer, and an optional thin isolation layer concentrically disposed between the low electrical resistivity layer and the optional thin oxidation protection layer.

FIG. 8 is a cross-sectional view of an embodiment of an electrical probe 810 including a high yield strength wire core 830, a low electrical resistivity layer 832, an optional thin oxidation protection layer 836 concentrically disposed over the low electrical resistivity layer, and an optional thin isolation layer 838 concentrically disposed between the low electrical resistivity layer and the optional thin oxidation protection layer. In some embodiments, the thin isolation layer may have a thickness ranging between about 0.1 to about 0.6 μm, or in some cases between about 0.3 to about 0.6 μm. In some embodiments, the thin isolation layer may include predominantly one or more of nickel, cobalt, and a combination thereof. In one particular embodiment, the thin isolation layer may include a 0.3 to 0.6 μm layer of nickel, although this is not required. The thin isolation layer may be operable to prevent, or at least reduce, contact and intermixing of the materials of the low electrical resistivity layer and the optional thin oxidation protection layer and/or the formation of intermetallic compounds. If the thin oxidation protection layer is omitted then the thin isolation layer may also optionally be omitted. In some embodiments, the thin isolation layer may be formed by plating (e.g., electroplating) a metal on the low electrical resistivity layer, and then the thin oxidation protection layer may be formed by plating (e.g., electroplating) on the thin isolation layer. The high yield strength wire core and the low electrical resistivity layer may be described in conjunction with FIG. 5. In another embodiment, the electrical probe may also optionally include the thin isolation layer 634 of FIG. 6.

Figure 9:
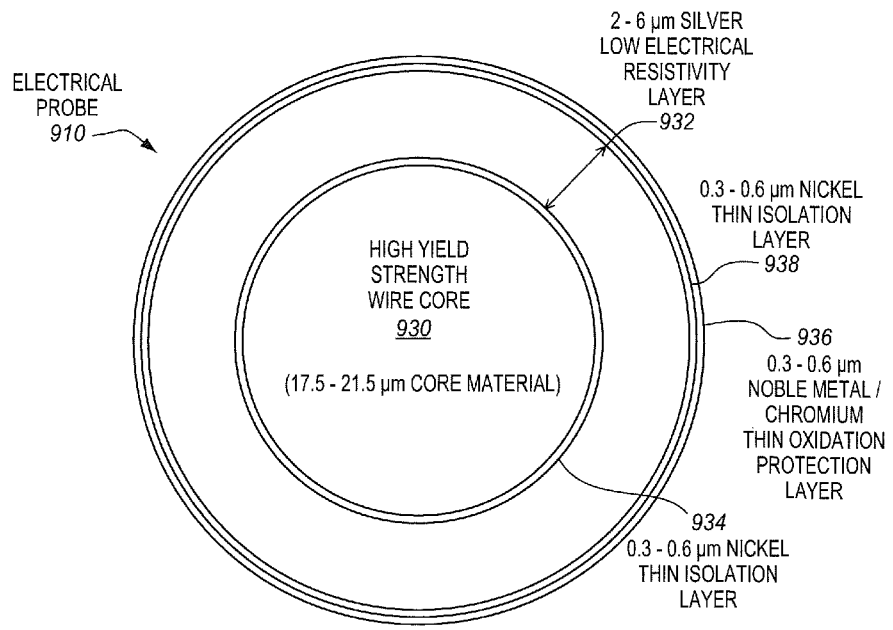
FIG. 9 is a cross-sectional view of a first detailed example embodiment of an electrical probe useful for testing electrical contacts having a pitch of about 90 µm.

FIG. 9 is a cross-sectional view of a first detailed example embodiment of an electrical probe 910 useful for testing electrical contacts having a pitch of about 90 μm. In the illustrated embodiment, the outer diameter of the electrical probe is 50 μm and the dimensions are consistent with a 50 μm outer diameter. In other embodiments the outer diameter may range between about 43 to about 50 μm, and the other dimensions may be scaled in accordance with the outer diameter. The electrical probe includes a high yield strength wire core 930. The high yield strength wire core has a radius that ranges between about 17.5 to about 21.5 μm. The high yield strength wire core includes a core material that is one or more of tungsten, tungsten-copper alloy, tungsten-nickel alloy, beryllium-copper alloy, molybdenum, stainless steel, and combinations thereof. In some embodiments, the high yield strength wire core includes one or more of tungsten, tungsten-copper alloy, tungsten-nickel alloy, or combinations thereof. A first thin isolation layer 934 is disposed concentrically over the high yield strength wire core. The first thin isolation layer 934 has a thickness that ranges between about 0.3 to about 0.6 μm. The first thin isolation layer 934 includes predominantly nickel, or in some cases consists of nickel. A low electrical resistivity layer 932 is disposed over the first thin isolation layer 934. The low electrical resistivity layer has a thickness that ranges between about 2 to about 6 μm. The low electrical resistivity layer includes predominantly silver, or in some cases consists of silver. A second thin isolation layer 938 is disposed concentrically over the low electrical resistivity layer. The second thin isolation layer 938 has a thickness that ranges between about 0.3 to about 0.6 μm. The second thin isolation layer 938 includes predominantly nickel, or in some cases consists of nickel. A thin oxidation protection layer 936 is disposed concentrically over the second thin isolation layer 938. The thin oxidation protection layer has a thickness that ranges between about 0.3 to about 0.6 μm. The thin oxidation protection layer includes one or more of a noble metal, chromium, or combinations thereof.

Figure 10:
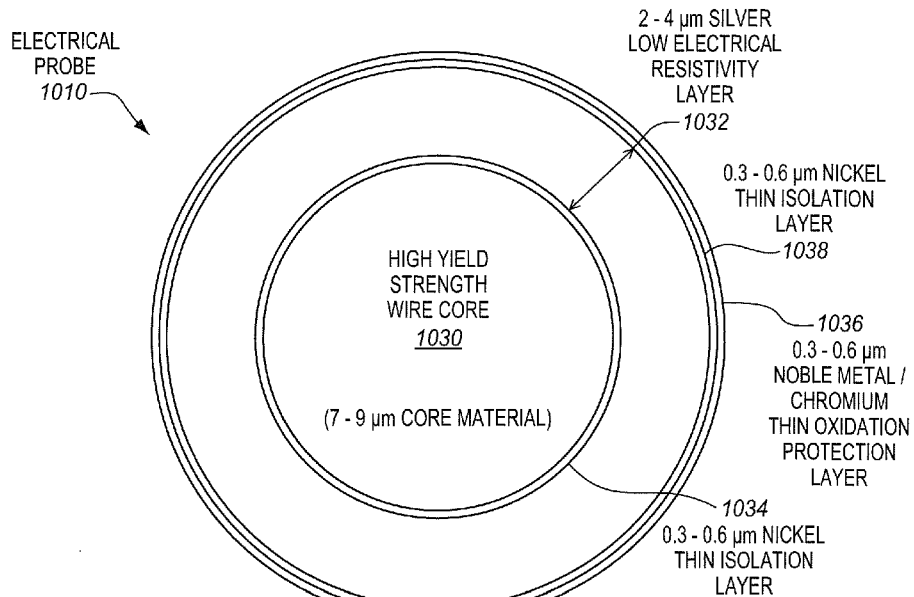
FIG. 10 is a cross-sectional view of a first detailed example embodiment of an electrical probe useful for testing electrical contacts having a pitch of about 45 µm.

FIG. 10 is a cross-sectional view of a first detailed example embodiment of an electrical probe 1010 useful for testing electrical contacts having a pitch of about 45 μm. In the illustrated embodiment, the outer diameter of the electrical probe is 50 μm and the dimensions are consistent with a 45 μm outer diameter. In other embodiments the outer diameter may range between about 40 to about 45 μm, and the other dimensions may be scaled in accordance with the outer diameter. The electrical probe includes a high yield strength wire core 1030. The high yield strength wire core has a radius that ranges between about 7 to about 9 μm. The high yield strength wire core includes a core material that is one or more of tungsten, tungsten-copper alloy, tungsten-nickel alloy, beryllium-copper alloy, molybdenum, stainless steel, and combinations thereof. In some embodiments, the high yield strength wire core includes one or more of tungsten, tungsten-copper alloy, tungsten-nickel alloy, or combinations thereof. A first thin isolation layer 1034 is disposed concentrically over the high yield strength wire core. The first thin isolation layer 1034 has a thickness that ranges between about 0.3 to about 0.6 μm. The first thin isolation layer 1034 includes predominantly nickel, or in some cases consists of nickel. A low electrical resistivity layer 1032 is disposed over the first thin isolation layer 1034. The low electrical resistivity layer has a thickness that ranges between about 2 to about 4 μm. The low electrical resistivity layer includes predominantly silver, or in some cases consists of silver. A second thin isolation layer 1038 is disposed concentrically over the low electrical resistivity layer. The second thin isolation layer 1038 has a thickness that ranges between about 0.3 to about 0.6 μm. The second thin isolation layer 1038 includes predominantly nickel, or in some cases consists of nickel. A thin oxidation protection layer 1036 is disposed concentrically over the second thin isolation layer 1038. The thin oxidation protection layer has a thickness that ranges between about 0.3 to about 0.6 μm. The thin oxidation protection layer includes one or more of a noble metal, chromium, or combinations thereof.

Advantageously, the electrical probes of FIGS. 9-10 may achieve electrical and thermal resistivity values that are approximately those of gold. This is due in part to the use of silver, which has lower electrical and thermal resistivity values. In some embodiments, for the electrical probe of FIG. 9, the overall or effective electrical resistivity value may range between about $2.7\times10^{-8}$ to about $3.1\times10^{-8}$ Ω-m, and the overall or effective thermal resistivity value may range between about 260 to about 280 W/m-K. In some embodiments, for the electrical probe of FIG. 10, the overall or effective electrical resistivity value may range between about $2.4\times10^{-8}$ to about $2.7\times10^{-8}$ Ω-m, and the overall or effective thermal resistivity value may range between about 290 to about 310 W/m-K. Moreover, these electrical and thermal resistivity values are obtained while retaining the high temperature mechanical strength and mechanical properties of the material of the wire core (e.g., those of tungsten, etc.). Rather than needing to select a single material or alloy to provide all of the desired electrical and thermal resistivity values as well as the mechanical strength and other mechanical properties, different materials may be used in the core and in one or more concentric layers to provide the desired properties.

In FIGS. 9-10, in some embodiments, the high yield strength wire core may represent a drawn wire that has been drawn through a wire forming die. Moreover, in some embodiments, each of the low electrical resistivity layer, the first thin isolation layer, the second thin isolation layer, and the thin oxidation protection layer may represent plated (e.g., electroplated) layers. Advantageously, such a method of manufacture, by drawing a wire core through a die and plating one or more layers on the wire core), may render the electrical probes relatively economical to manufacture especially relative to electrical probes formed by a lithographic process as mentioned in the background section of this application.

Figure 11:
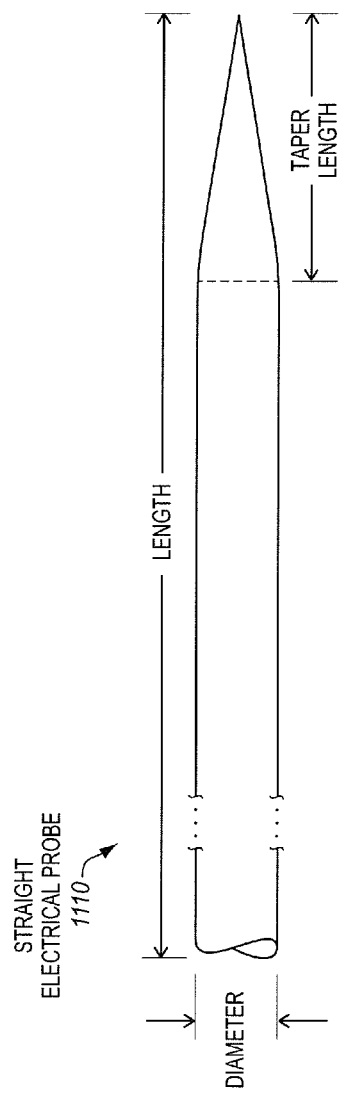
FIG. 11 illustrates an embodiment of a straight electrical probe.

FIG. 11 illustrates an embodiment of a straight electrical probe 1110. The straight electrical probe has a length of at least about 500 μm up to many thousands of micrometers, or even longer. The straight electrical probe has a round or substantially circular cross section with a diameter or other cross-sectional dimension that in some embodiments is no more than 50 μm, and in other embodiments is no more than 25 μm. A terminal end of the straight electrical probe intended to contact electrical contacts is tapered along a taper length. In some embodiments, the taper length may be on the order of tens to several hundred micrometers. In the illustration, the terminal end is tapered to a sharp point, although in other embodiments the terminal end may be tapered to a lesser diameter but not a sharp point. In some cases, etching may be used to taper the end and the terminal point may be sanded back to the desired diameter. Other aspects of the straight electrical probe may be as described elsewhere herein.

Figure 12:
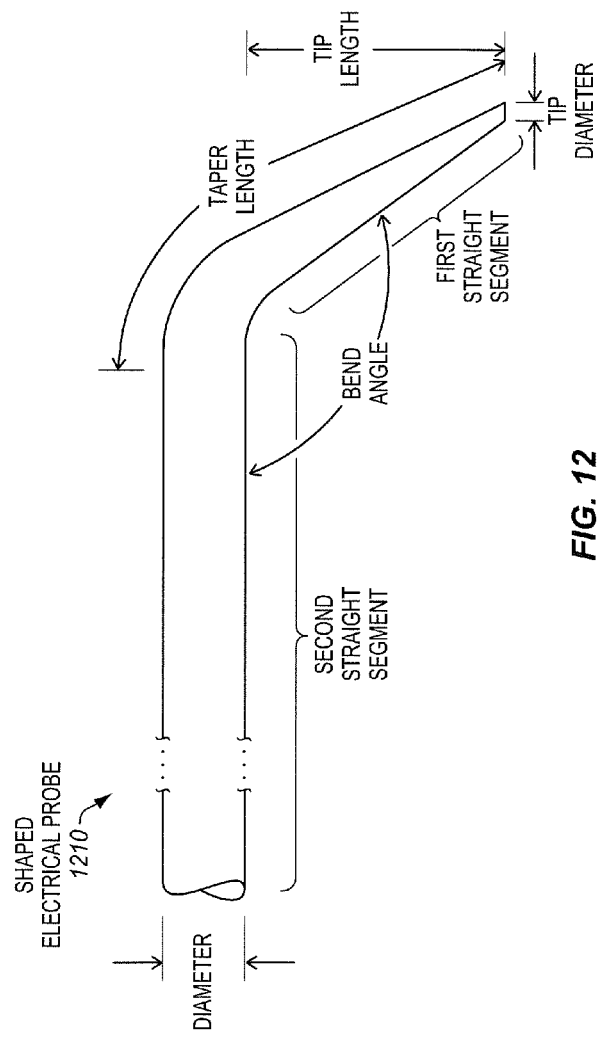
FIG. 12 illustrates a first embodiment of a shaped electrical probe.

FIG. 12 illustrates a first embodiment of a shaped electrical probe 1210. The shaped electrical probe has a length of at least about 500 μm up to many thousands of micrometers, or even longer. The shaped electrical probe has a round or substantially circular cross section with a diameter or other cross-sectional dimension that in some embodiments is no more than 50 μm, and in other embodiments is no more than 25 μm. This embodiment of the shaped electrical probe has a single bend near the terminal end intended to contact electrical contacts (e.g., within from tens to several hundred micrometers from the terminal end). The shaped electrical probe includes a first straight segment between the terminal end intended to contact electrical contacts and the bend that has a tip length, a second straight segment between the other terminal end of the electrical probe and the bend, and a bend between the first and second straight segments. In some embodiments, the first straight segment may be significantly shorter than the second straight segment. The bend may have an internal bend angle. The magnitude of the internal bend angle affects the "scrubbing" action of the probe on the contact pad. Too large a bend angle may tend to cause the probe to slide off the electrical contact without proper scrubbing of a surface oxide, whereas too narrow a bend angle may tend to cause the probe to press too hard on the contact and potentially cause damage. In some embodiments, the internal bend angle may range between about 98° to about 108°, in some cases between about 100° to about 106°. A terminal end of the shaped electrical probe intended to contact electrical contacts is tapered along a taper length. In some embodiments, the taper length may be on the order of tens to several hundred micrometers. In the illustration, the terminal end is tapered to a reduced tip diameter or other cross-sectional dimension, although in other embodiments the terminal end may be tapered to a sharp point. In some cases, etching may be used to taper the end and the terminal point may be sanded, grinded, or otherwise modified back to the desired tip diameter. The taper may begin before or after the bend starts. Other aspects of the shaped electrical probe may be as described elsewhere herein.

Figure 13:
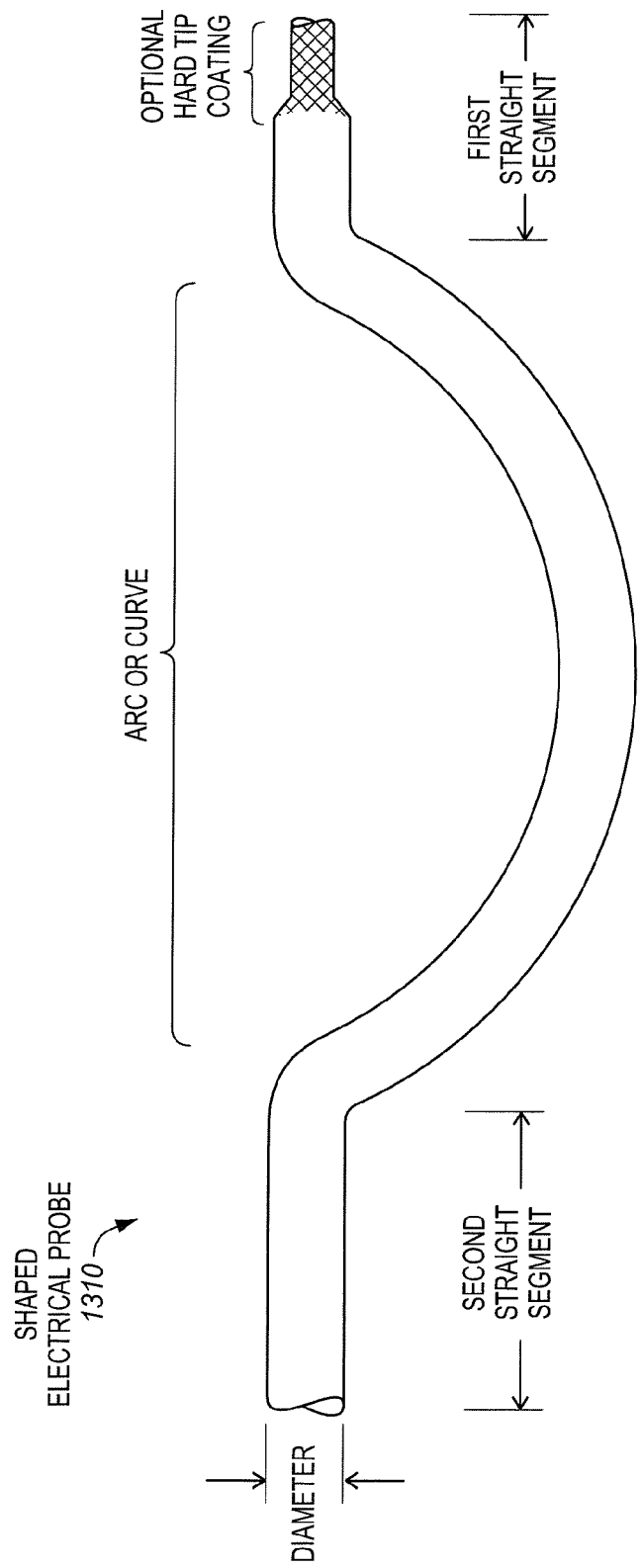
FIG. 13 illustrates a second embodiment of a shaped electrical probe.

FIG. 13 illustrates a second embodiment of a shaped electrical probe 1310. The shaped electrical probe has a length of at least about 500 μm up to many thousands of micrometers, or even longer. The shaped electrical probe has a round or substantially circular cross section with a diameter or other cross-sectional dimension that in some embodiments is no more than 50 μm, and in other embodiments is no more than 25 μm. This embodiment of the shaped electrical probe has central arc or curve. The shaped electrical probe includes a first straight segment between the terminal end intended to contact electrical contacts and the arc or curve, a second straight segment between the other terminal end of the electrical probe and the arc or curve, and the arc or curve between the first and second straight segments. In some embodiments, the arc or curve may extend across at least a majority of a length of the electrical probe. A terminal end of the shaped electrical probe intended to contact electrical contacts has a hard tip. The hard tip may include an extension of a central core of the electrical probe that is coated or covered with a hard tip coating. An example of such a hard tip coating is rhodium. Alternatively, the terminal end may be tapered as previously described with or without such a hard tip coating. Other aspects of the shaped electrical probe may be as described elsewhere herein.

These are just a few illustrative examples of suitable shaped electrical probes. Other shaped probes known in the arts are also suitable.

Figure 14:
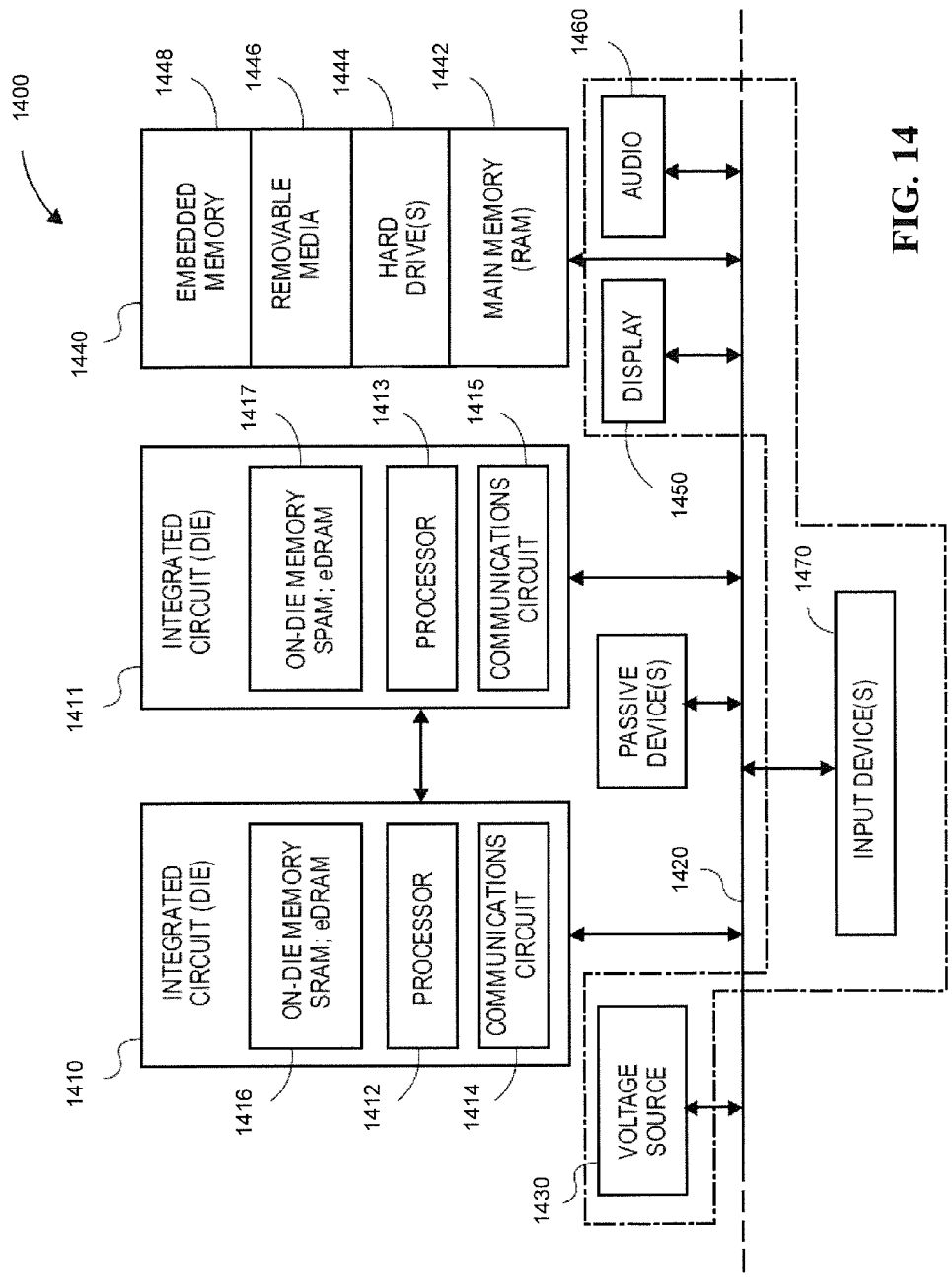
FIG. 14 illustrates one embodiment of a computer system.

FIG. 14 illustrates one embodiment of a computer system 1450. The computer system (also referred to as the electronic system) as depicted and integrated circuits thereof can be tested with probes disclosed herein. The computer system may be a mobile device such as a netbook computer. The computer system may be a mobile device such as a wireless smart phone. The computer system may be a desktop computer. The computer system may be a hand-held reader. The computer system may be a server system. The computer system may be a supercomputer or high-performance computing system.

In an embodiment, the electronic system is a computer system that includes a system bus 1420 to electrically couple the various component blocks of the electronic system. The system bus is a single bus or any combination of busses according to various embodiments. The electronic system includes a voltage source 1430 that provides power to the integrated circuit 1410. In some embodiments, the voltage source supplies current to the integrated circuit through the system bus.

The integrated circuit is electrically coupled to the system bus and includes any circuit, or combination of circuits according to an embodiment. In an embodiment, the integrated circuit includes a processor 1412 that can be of any type. As used herein, the processor may mean any type of circuit such as, but not limited to, a microprocessor, a microcontroller, a graphics processor, a digital signal processor, or another processor. In an embodiment, SRAM embodiments are found in memory caches of the processor. Other types of circuits that can be included in the integrated circuit are a custom circuit or an application-specific integrated circuit (ASIC), such as a communications circuit 1414 for use in wireless devices such as cellular telephones, smart phones, pagers, portable computers, two-way radios, and similar electronic systems, or a communications circuit for servers. In an embodiment, the integrated circuit includes on-die memory 1416 such as static random-access memory (SRAM). In an embodiment, the integrated circuit includes embedded on-die memory such as embedded dynamic random-access memory (eDRAM).

In an embodiment, the integrated circuit is complemented with a subsequent integrated circuit 1411. Useful embodiments include a dual processor 1413 and a dual communications circuit 1415 and dual on-die memory 1417 such as SRAM. In an embodiment, the dual integrated circuit includes embedded on-die memory such as eDRAM.

In an embodiment, the electronic system also includes an external memory 1440 that in turn may include one or more memory elements suitable to the particular application, such as a main memory 1442 in the form of RAM, one or more hard drives 1444, and/or one or more drives that handle removable media 1446, such as diskettes, compact disks (CDs), digital variable disks (DVDs), flash memory drives, and other removable media known in the art. The external memory may also be embedded memory 1448 such as the first die in an embedded TSV die stack, according to an embodiment.

In an embodiment, the electronic system also includes a display device 1450, an audio output 1460. In an embodiment, the electronic system includes an input device such as a controller 1470 that may be a keyboard, mouse, trackball, game controller, microphone, voice-recognition device, or any other input device that inputs information into the electronic system. In an embodiment, an input device is a camera. In an embodiment, an input device is a digital sound recorder. In an embodiment, an input device is a camera and a digital sound recorder.

As shown herein, the integrated circuit can be implemented in a number of different embodiments, including a test system, and their equivalents, an electronic system, a computer system, one or more methods of fabricating an integrated circuit, and one or more methods of fabricating an electronic assembly that includes a semiconductor die packaged. The elements, materials, geometries, dimensions, and sequence of operations can all be varied to suit particular I/O coupling requirements including array contact count, array contact configuration for a microelectronic die embedded in a processor mounting substrate according to any of the several disclosed semiconductor die packaged with a thermal interface unit and their equivalents. A foundation substrate may be included, as represented by the dashed line of FIG. 14. Passive devices may also be included, as is also depicted in FIG. 14.

In the description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

In the description above, for the purposes of explanation, numerous specific details have been set forth in order to provide a thorough understanding of the embodiments of the invention. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known circuits, structures, devices, and operations have been shown in block diagram form or without detail in order to avoid obscuring the understanding of the description.

Modifications may be made to the embodiments disclosed herein, such as, for example, to the sizes, shapes, configurations, forms, functions, materials, and manner of operation, and assembly and use, of the components of the embodiments. All equivalent relationships to those illustrated in the drawings and described in the specification are encompassed within embodiments of the invention. For simplicity and clarity of illustration, elements illustrated in the figures have not necessarily been drawn to scale. For example, the dimensions of some of the elements are exaggerated relative to other elements for clarity. Further, where considered appropriate, reference numerals or terminal portions of reference numerals have been repeated among the figures to indicate corresponding or analogous elements, which may optionally have similar characteristics.

Various operations and methods have been described. Some of the methods have been described in a basic form in the flow diagrams, but operations may optionally be added to and/or removed from the methods. In addition, while the flow diagrams show a particular order of the operations according to example embodiments, it is to be understood that that particular order is exemplary. Alternate embodiments may optionally perform the operations in different order, combine certain operations, overlap certain operations, etc. Many modifications and adaptations may be made to the methods and are contemplated.

It should also be appreciated that reference throughout this specification to "one embodiment", "an embodiment", or "one or more embodiments", for example, means that a particular feature may be included in the practice of the invention. Similarly, it should be appreciated that in the description various features are sometimes grouped together in a single embodiment, Figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

What is claimed is:

1. An electrical probe comprising:
   a high yield strength wire core including predominantly one or more materials selected from the group consisting of tungsten, tungsten-copper alloy, tungsten-nickel alloy, beryllium-copper alloy, molybdenum, stainless steel, and combinations thereof, the high mechanical strength wire core having a yield strength of at least 1 gigapascal at a temperature of 250° C.;
   a low electrical resistivity layer concentrically around the high yield strength wire core, the concentric layer including predominantly one or more materials selected from the group consisting of silver, gold, copper, and combinations thereof, the low electrical resistivity layer having an electrical resistivity of no more than $2 \times 10^{-8}$ Ohm-meters ($\Omega$m);
   a first thin isolation layer concentrically disposed between the high yield strength wire core and the low electrical resistivity layer, wherein the first thin isolation layer is disposed directly on the high yield strength wire core and includes predominantly one or more materials selected from the group consisting of nickel and cobalt and wherein the low electrical resistivity layer is disposed directly on the thin isolation layer;
   an outer cross-sectional dimension of the electrical probe that is no more than 50 micrometers ($\mu$m);
   between 60 to 85% of the outer cross-sectional dimension provided by the high mechanical strength wire core; and between 10 to 30% of the outer cross-sectional dimension provided by the low electrical resistivity layer.

2. The electrical probe of claim 1, wherein the low electrical resistivity layer includes predominantly silver.

3. The electrical probe of claim 1, wherein the high yield strength wire core includes predominantly tungsten.

4. The electrical probe of claim 1, further comprising the first thin isolation layer having a thickness of between 0.1 to 0.6 μm.

5. The electrical probe of claim 4, further comprising a thin oxidation protection layer concentrically disposed around the low electrical resistivity layer and providing an outside surface of the electrical probe, the thin oxidation protection layer having a thickness of between 0.1 and 0.6 μm, the thin oxidation protection layer including predominantly one or more materials selected from the group consisting of gold, platinum, ruthenium, rhodium, palladium, osmium, iridium, chromium, and combinations thereof.

6. The electrical probe of claim 5, further comprising a second thin isolation layer concentrically disposed between the low electrical resistivity layer and the thin oxidation protection layer, the second thin isolation layer having a thickness of between 0.1 to 0.6 μm, the second thin isolation layer including predominantly one or more materials selected from the group consisting of nickel, cobalt, and combinations thereof.

7. The electrical probe of claim 1, wherein the electrical probe has an electrical resistivity of no more than $3 \times 10^{-8} \Omega\text{-m}$, and wherein the electrical probe has a yield strength of at least 500 MPa.

8. The electrical probe of claim 1, wherein between 65 to 80% of the outer cross-sectional dimension is provided by the high mechanical strength wire core, and wherein between 15 to 25% of the outer cross-sectional dimension is provided by the low electrical resistivity layer.

9. The electrical probe of claim 1, wherein the outer cross-sectional dimension of the electrical probe is no more than 25 μm.

10. The electrical probe of claim 1, further comprising:
the first thin isolation layer having a thickness of between 0.1 to 0.6 μm;
a thin oxidation protection layer concentrically disposed around the low electrical resistivity layer and providing an outside surface of the electrical probe, the thin oxidation protection layer having a thickness of between 0.1 and 0.6 μm, the thin oxidation protection layer including predominantly one or more materials selected from the group consisting of gold, platinum, ruthenium, rhodium, palladium, osmium, iridium, chromium, and combinations thereof; and
a second thin isolation layer concentrically disposed between the low electrical resistivity layer and the thin oxidation protection layer, the second thin isolation layer having a thickness of between 0.1 to 0.6 μm, the second thin isolation layer including predominantly one or more materials selected from the group consisting of nickel, cobalt, and combinations thereof.

11. The electrical probe of claim 1, wherein the electrical probe has one of:
a first straight segment, a second straight segment, and a bend between the first and second straight segments, an inner bend angle of the bend ranging from 100-105 degrees; or
a first straight segment, a second straight segment, and an arc between the first and second straight segments.

12. A probe holder comprising:
a printed circuit board;
a probe mechanical support physically coupled with the printed circuit board;
a plurality of electrical probes, the electrical probes physically coupled with the probe mechanical support and electrically coupled with the printed circuit board, at least one of the electrical probes including:
a high yield strength wire core including predominantly one or more materials selected from tungsten, tungsten-copper alloy, tungsten-nickel alloy, beryllium-copper alloy, molybdenum, stainless steel, and combinations thereof, the high mechanical strength wire core having a yield strength of at least 1 gigapascal at a temperature of 250° C.;
a low electrical resistivity layer concentrically around the high yield strength wire core, the concentric layer including predominantly one or more materials selected from the group consisting of silver, gold, copper, and combinations thereof, the low electrical resistivity layer having an electrical resistivity of no more than $2 \times 10^{-8} \Omega\text{m}$;
a first thin isolation layer concentrically disposed between the high yield strength wire core and the low electrical resistivity layer, wherein the first thin isolation layer is disposed directly on the high yield strength wire core and includes predominantly one or more materials selected from the group consisting of nickel and cobalt and wherein the low electrical resistivity layer is disposed directly on the thin isolation layer;
an outer cross-sectional dimension of the electrical probe that is no more than 50 μm; between 60 to 85% of the outer cross-sectional dimension provided by the high mechanical strength wire core; and
between 10 to 30% of the outer cross-sectional dimension provided by the low electrical resistivity layer.

13. The probe holder of claim 12, wherein the low electrical resistivity layer includes predominantly silver.

14. The probe holder of claim 13, wherein the high yield strength wire core includes predominantly tungsten.

15. The probe holder of claim 12, further comprising:
the first thin isolation layer having a thickness of between 0.1 to 0.6 μm; and
a thin oxidation protection layer concentrically disposed around the low electrical resistivity layer and providing an outside surface of the electrical probe, the thin oxidation protection layer having a thickness of between 0.1 and 0.6 μm, the thin oxidation protection layer including predominantly one or more materials selected from the group consisting of gold, platinum, ruthenium, rhodium, palladium, osmium, iridium, chromium, and combinations thereof.

16. The probe holder of claim 12, wherein the outer cross-sectional dimension of the electrical probe is no more than 25 μm.

17. A method comprising:
introducing a wafer having a plurality of exposed electrical contacts into an integrated circuit test system, the exposed electrical contacts having a pitch of no more than 90 micrometers (μm);
contacting an exposed electrical contact of the plurality with an electrical probe, the electrical probe including:
a high yield strength wire core including predominantly one or more materials selected from the group consisting of tungsten, tungsten-copper alloy, tungsten-nickel alloy, beryllium-copper alloy, molybdenum, stainless steel, and combinations thereof;

a low electrical resistivity layer concentrically around the high yield strength wire core, the concentric layer including predominantly silver;

a first thin isolation layer concentrically disposed between the high yield strength wire core and the low electrical resistivity layer, wherein the first thin isolation layer is disposed directly on the high yield strength wire core and includes predominantly one or more materials selected from the group consisting of nickel and cobalt and wherein the low electrical resistivity layer is disposed directly on the thin isolation layer;

an outer cross-sectional dimension of the electrical probe that is no more than 50 micrometers (μm);

between 60 to 85% of the outer cross-sectional dimension provided by the high mechanical strength wire core; and between 10 to 30% of the outer cross-sectional dimension provided by the low electrical resistivity layer; and exchanging an electrical signal between the electrical probe and the electrical contact.

18. The method of claim 17, further comprising the first thin isolation layer having a thickness of between 0.1 to 0.6 μm.

19. The method of claim 18, further comprising a thin oxidation protection layer concentrically disposed around the low electrical resistivity layer and providing an outside surface of the electrical probe, the thin oxidation protection layer having a thickness of between 0.1 and 0.6 μm, the thin oxidation protection layer including predominantly one or more materials selected from the group consisting of gold, platinum, ruthenium, rhodium, palladium, osmium, iridium, chromium, and combinations thereof.

20. The method of claim 17, wherein the outer cross-sectional dimension of the electrical probe is no more than 25 μm.

* * * * *